United States Patent [19]

Blanchard

[11] 4,345,265

[45] Aug. 17, 1982

[54] MOS POWER TRANSISTOR WITH IMPROVED HIGH-VOLTAGE CAPABILITY

[75] Inventor: Richard A. Blanchard, Los Altos Hills, Calif.

[73] Assignee: Supertex, Inc., Sunnyvale, Calif.

[21] Appl. No.: 139,654

[22] Filed: Apr. 14, 1980

[51] Int. Cl.³ .......................................... H01L 29/78
[52] U.S. Cl. ...................................... 357/23; 357/41; 357/52
[58] Field of Search ................ 357/23, 52, 41, 23 VT, 357/23 VD, 23 C, 23 S, 23 D, 23 CS, 23 R

[56] References Cited

U.S. PATENT DOCUMENTS

| | | | |
|---|---|---|---|
| 4,145,700 | 3/1979 | Jambotkar | 357/52 X |
| 4,199,774 | 4/1980 | Plummer | 357/23 X |
| 4,233,617 | 11/1980 | Klaspen | 357/23 |

*Primary Examiner*—Martin H. Edlow
*Attorney, Agent, or Firm*—Harry M. Weiss

[57] ABSTRACT

Device means for reducing latch-back breakdown thus raising the reverse-biased power capability of a DMOS transistor or the like. A DMOS transistor is an MOS field effect transistor comprising a lightly-doped (usually diffused) body region formed in a drain region; a heavily-doped source region is located in the body region in proximity to the drain. Since such a device structure also exhibits substantial bipolar transistor action, it is prone to latch-back breakdown. Means for reducing latch-back breakdown include providing a distributed diode with a lower breakdown voltage than the DMOS transistor to non-destructively absorb reverse transients or by providing shunt conductance means for the diffused channel region to reduce both the voltage and the voltage gradient in the base of the parasitic bipolar device. These means may be used singly or in combination.

15 Claims, 6 Drawing Figures

MOS POWER TRANSISTOR WITH IMPROVED HIGH-VOLTAGE CAPABILITY

BACKGROUND OF THE INVENTION

1. Field of the Invention

This invention relates generally to semiconductor power structures where the major current flow is perpendicular to the surface of the device. Such devices include vertical MOS power transistors, especially those of the DMOS variety. More particularly, the invention is especially applicable to MOS devices whose body region lies entirely within the drain and whose source region lies entirely within the body region.

2. Description of the Prior Art

MOS structures, whose major current flow was perpendicular to the surface of the structure, have been employed mainly in the fabrication of MOS power transistor devices. Because the relatively lightly doped channel is quite short between the source and the drain region of these MOS power transistor devices, substantial bipolar transistor action can be obtained. That is, minority carriers injected by the relatively heavily doped source region have a very high probability of reaching the reverse biased drain-channel junction. To prevent such undesirable bipolar injection, the source is ordinarily shorted to the body region at a point remote from the desired conducting channel of the device. At high currents, however, such shorting techniques are only partially effective because of the lateral voltage drops which are set up in the body region of the device and which tend to forward bias the source-body region adjacent the conducting channel. MOS power transistors are made to have a relatively high current carrying capability; however, when an attempt is made to turn off the device through an inductive load, the drain-channel voltage may build up very rapidly, thus, causing the device to go into breakdown. As is well known, the collector-emitter breakdown of a bipolar transistor is substantially less than its collector-base breakdown which corresponds to the drain-channel breakdown of a MOS transistor. The greater the current gain of the parasitic bipolar transistor, the greater the diminution in breakdown voltage in the collector-emitter mode. Current gain in a bipolar transistor may be reduced by increasing the doping in its base region; this technique, however, is generally impractical for the parasitic bipolar transistor contained in an MOS transistor because of the constraints on the doping and the length of the MOS channel in order for the desired surface conduction to occur.

In addition to the reduction in breakdown voltage that may occur because of the parasitic bipolar transistor included in an MOS transistor, this breakdown may be so localized that the semiconductor device itself is destroyed. This happens because a bipolar transistor in the collector-emitter breakdown mode supplies its own base current without the necessity for external base connection. Because the bipolar transistor exhibits a negative resistance over one or more portions in its collector-emitter breakdown mode, the current will be locally increased until heating causes destruction of the semiconductor junctions and/or the metallized contacts to the semiconductor device.

In order to achieve high reverse power capability, then the device must either be turned off slowly to limit the build-up of destructive voltage (which of course limits the speed of the device in common applications), or the parasitic bipolar transistor action must be reduced or eliminated in order to obviate the undesirable breakdown modes associated therewith. Known prior art power MOS devices are severely limited by such secondary breakdown modes.

SUMMARY OF THE INVENTION

It is an object of this invention to provide an improved semiconductor device and fabrication method therefor.

It is a further object of this invention to provide an improved MOS power transistor wherein the current flow is primarily perpendicular to the major surface of the device.

It is another object of this invention to provide an improved MOS power transistor device with increased reverse power handling capabilities.

It is still another object of this invention to provide an improved transistor device with internal clamping means to limit the breakdown voltage to a value below that at which destructive bipolar transistor latch-back breakdown occurs.

BRIEF DESCRIPTION OF THE PREFERRED EMBODIMENT

In order to accomplish the foregoing objectives and others, in accordance with one embodiment of this invention, there is provided a power MOS device structure having contiguous primary and adjunct body means, said adjunct body means providing a lower breakdown voltage than said primary means in order to obviate breakdown in the sensitive regions of the device. The adjunct body means, for example, may comprise a body region which is deeper than the primary body region and which will thus exhibit a reduced breakdown voltage because of the shorter drain length over which the breakdown field must be spread. Such an adjunct body region preferably parallels the primary body region over the effective periphery of the device in order to provide a low impedance clamp for reducing the destructive effect of breakdown. In the alternative, the periphery of the adjunct body region may have a lower breakdown voltage than the primary drain-body junction in order to provide the breakdown limiting function.

In accordance with another embodiment of this invention, there is provided shunt conductance means in parallel with the base-like body portion underneath the source of the device. The relatively high conductivity shunt means is electrically located between the active channel portion of the device and the source body which is used to reduce the bipolar transistor action. Thus, both the forward voltage bias in the active channel region and the voltage gradient underneath the source region are reduced. In the embodiment described, the increased shunt conductance may be supplied either by geometrical techniques or by a special fabrication method to enhance the doping underneath the source portion of the device.

The foregoing embodiments may further be combined in order to achieve MOS power transistor devices with yet higher reverse energy carrying capabilities.

The above brief description and other objects, features, and advantages of the present invention will be more clearly understood in the following detailed description taken in conjunction with the accompanying drawings, in which:

THE SPECIFICATION

Figure 1:
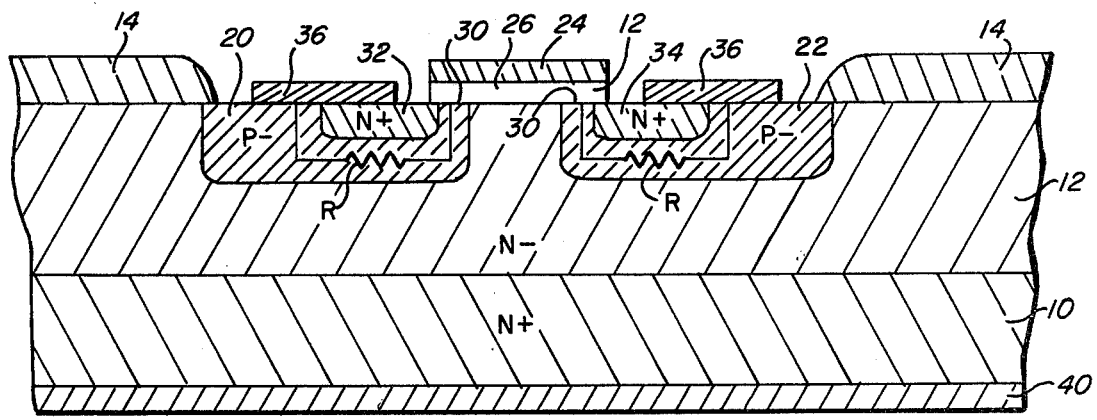
FIG. 1 is a cross-section elevation showing a portion of a known DMOS power device.

FIG. 1 shows a portion of a known type of DMOS semiconductor device. Referring to FIG. 1, an N+ region 10 is located at the bottom of the DMOS structure and functions as a common drain region. Located on the N+ drain region 10 is an N− region 12 which is also part of the common drain region and serves to sustain a high breakdown voltage where the device is used as a power transistor. An insulating layer 14 is located on the surface of the DMOS device structure of FIG. 1, and a pair of locally separated P− body regions 20 and 22 are located within the N− common drain region 12. The P− body regions may merge at another point of the structure, as for example where the structure comprises a body region surrounding a common N− drain region 12. A gate electrode 24, preferably of doped polysilicon, is spaced from the semiconductor substrate surface by a thin insulating layer 26. The gate electrode 24 serves to simultaneously bias the channels 30 formed between N+ source regions 32 and 34, respectively located within the P− body regions 20 and 22, and the common N− drain region 12. Metal contacts 36 serve to electrically short each separate N+ source region to the surrounding P− body region. A drain electrode or contact 40 is provided to the backside of the N+ region 10 and a gate electrode contact (not shown) is provided to the gate electrode 24. Thus, in operation, the drain electrode 40 serves as a common drain electrode and the gate electrode 24 permits electron flow from the N+ source regions 32 and 34 to cross the channel or channels formed by the adjacent P− regions 20 and 22. Of course, all the conductivity types might be reversed to provide thereby a P channel transistor; this would not ordinarily be done for a power transistor (because of the lower mobility of holes) but might be desirable, e.g. where electrically complementary structures are required. Also, in the case of a power transistor, the structure depicted in FIG. 1 in cross section will extend into the plane of the drawing by an effective distance which may be on the order of inches for a multiple-ampere power transistor. This peripheral channel dimension may be provided, for example, by making the device comprising a series of fingers, each one of which resembles FIG. 1 in cross section.

From FIG. 1, it may be seen that the DMOS structure herein described has many similarities with a vertical NPN transistor. For example, regions 32 and 34 are heavily doped like an emitter region; regions 20 and 22 are lightly doped like a base region; and the combination N+ and N− substrate is typical of that used in high voltage transistors.

In fact, the difference between the structure shown in FIG. 1 and a bipolar transistor apart from the provision of gate 24 is the fact that the source electrodes 36 short the bipolar emitter regions 32 and 34 to the bipolar base regions 20 and 22 (which may be merged) respectively, thus keeping the bipolar device from having any substantial current gain, at least below drain-body breakdown. Because of the necessity to provide the channel regions 30 under the gate 24 in the DMOS device, not all the edges of the N+ regions 32 and 34 can be shorted. This means that, in the case where there is a possibility of base current flow into the P− body regions 20 and 22, the base current will have to flow through the lateral resistance R in order to reach the emitter-base short provided by electrode regions 36. In order to get substantial bipolar transistor action, the base region must be forward biased by about 0.6 volts with respect to the emitter region. Thus, when the lateral current flow in effective resistance R is sufficient to engender a potential shift of this magnitude, substantial bipolar transistor action may occur in the vicinity of the channel regions of the DMOS transistor.

Figure 2:
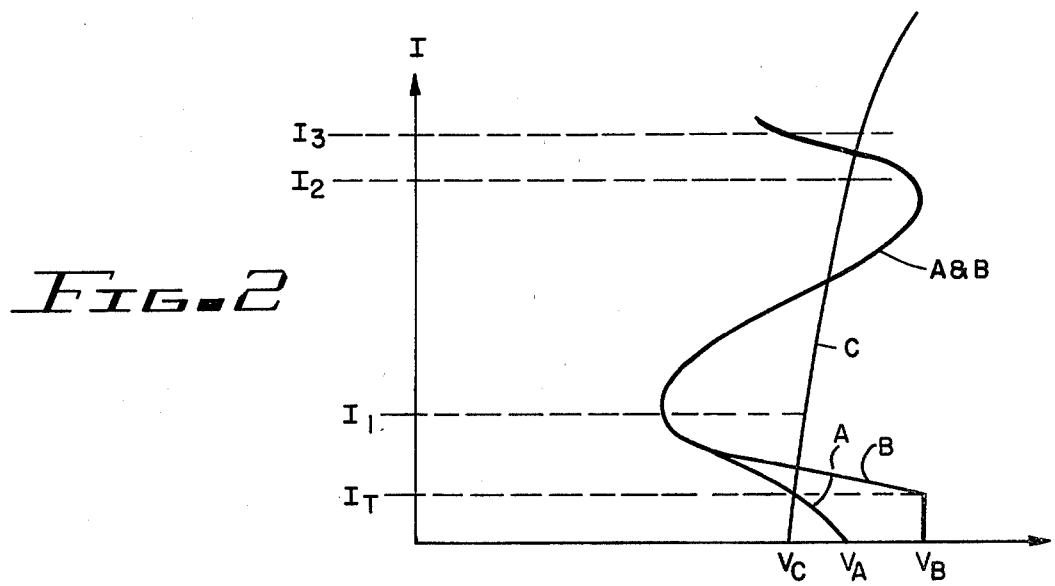
FIG. 2 is an illustration of the high voltage characteristics of a device of the type shown in FIG. 1.

FIG. 2 is useful in explaining how the parasitic bipolar transistor action may unfavorably influence the power handling capabilities of the DMOS transistor. In this Figure, let $V_b$ be the breakdown voltage of the P− N− N+ junction of FIG. 1. Ideally then, the DMOS device would sustain a breakdown voltage $V_B$ at arbitrary current levels. A bipolar transistor without a shorted emitter-base junction would have a collector to emitter breakdown voltage $V_A$ somewhat less than $V_B$ at low current as depicted in FIG. 2. As the current is increased, this bipolar breakdown voltage would be decreased even more to the minimum value at a current $I_1$ along the curve A; this minimum value of voltage is often approximately half of $V_B$. As the current is increased further along the curve A, the voltage will increase perhaps to a value comparable to the original breakdown voltage until a current $I_2$ is reached at which point a negative resistance may again be seen. At this point, the power is so high that destruction will occur at a current of $I_3$ unless the current is suitably limited by external means.

With a shunting resistance across the emitter-base junction of the bipolar transistor, a curve more similar to that shown by B of FIG. 2 is usually obtained. Here the voltage reaches the breakdown voltage $V_B$ of the collector-base PN junction, and, at this voltage, the current may be increased to the threshold current $I_T$ at which point the negative resistance sets in and the voltage drops rapidly to the minimum value at and above which current curve B is very similar to curve A.

Thus, in FIG. 2, it may be seen that there are several important effects by which parasitic bipolar transistor action may effectively inhibit the reverse power capability of the DMOS transistor. First of all, the fact that the bipolar transistor exhibits a negative resistance and switches back to a voltage which is on the order of half of the initial breakdown voltage of the device substantially reduces the voltage which can be sustained by the DMOS device in the reverse mode. Secondly, the fact that the parasitic bipolar device exhibits a second negative resistance region at high currents means that it can induce a local breakdown that is of sufficiently high power that it can destroy the device. It will be seen that the effect of the emitter-base shunting resistor at low currents does not substantially enhance the power carrying ability of the device because $I_T$ is not very large for a device like that in FIG. 1 where R is quite high.

The embodiments hereinafter illustrated improve the power handling capabilities of the DMOS transistor by effectively increasing the current $I_T$ by decreasing the series resistance R in the lateral base switch region of the parasitic bipolar transistor and/or by adding a clamping diode in parallel with the DMOS device and its parasitic bipolar transistor in order to preclude the obtention of breakdown in the vicinity of the channel of the DMOS device so that the breakdown current will not pass through the lateral resistance in the base of the parasitic bipolar transistor.

Figure 3:
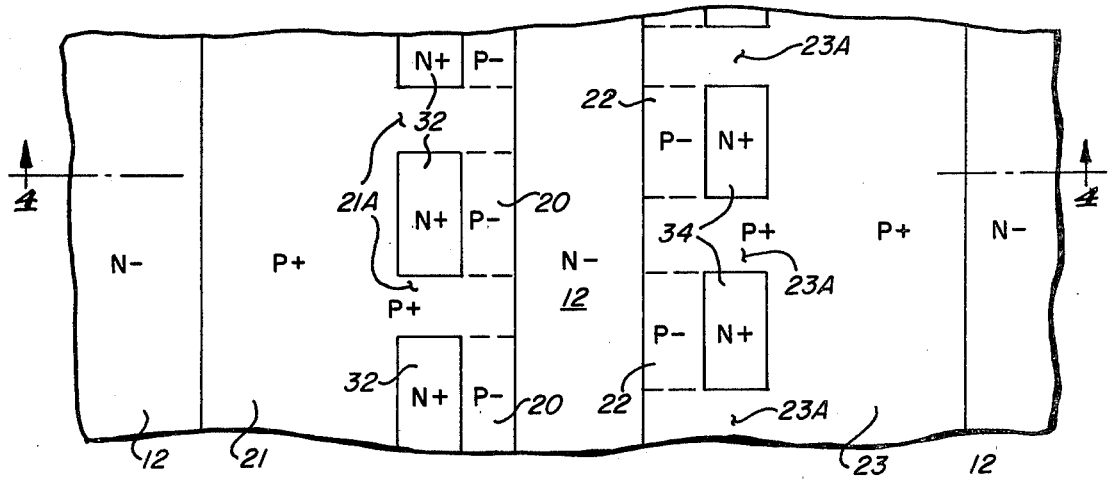
FIG. 3 is a top view of a portion of a DMOS power device showing the improvements according to this invention.
Figure 4:
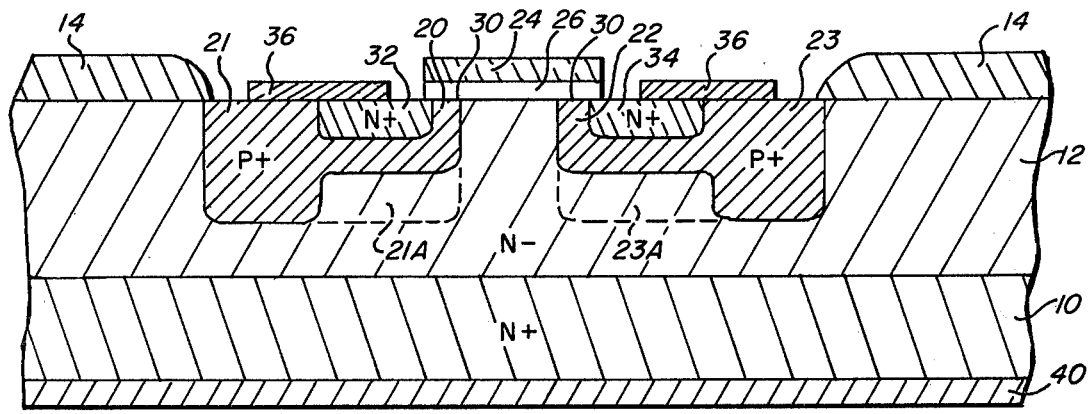
FIG. 4 is a cross-sectional elevation of the device of FIG. 3 showing in more detail the various features of the improved structure.

FIGS. 3 and 4 show preferred embodiments of the inventive device structure as a top view and cross section, respectively. In the embodiment shown in FIG. 4, the P— body regions 20 and 22 are now abutted by adjunct P+ body regions 21 and 23 which are deeper and of lower resistivity than regions 20 and 22. By virtue of the lower resistivity of adjunct regions 21 and 23, and because of the smaller spacing of adjunct regions 21 and 23 from the N+ substrate, the breakdown voltage will be less than regions 20 and 22. If, in addition, the area of regions 21 and 23 facing the N+ substrate region 10 is greater than that of regions 20 and 22 collectively, then the breakdown impedance of the adjunct regions 21 and 23 will be less than that of the primary body regions 20 and 22.

The effect of regions 21 and 23 in enhancing the breakdown characteristic of the DMOS structure comes about in several ways. First, the fact that the breakdown occurs at the external periphery of or beneath regions 21 and 23 diverts breakdown from the sensitive channel regions of the DMOS device in the P— regions under the gate 24. Thus, less breakdown current will pass through the parasitic resistance R as in FIG. 1 so that less voltage is available to turn on the parasitic bipolar transistor. This effect is shown in FIG. 2 where the breakdown voltage of the adjunct regions 21 and 23 is shown by curve C. Their breakdown voltage $V_C$ is lower than that of the DMOS device which breaks down at $V_B$. However, if the impedance of the adjunct region breakdown is sufficiently low, it can divert the breakdown current from the channel regions for currents in the range of $I_1$ and, thus, effectively enhance the breakdown voltage in this current range. As shown by FIG. 2, the adjunct region breakdown also protects the DMOS device at higher currents. Here, the parasitic bipolar transistor would break down if the device could reach the current $I_2$ which is the onset of the second negative resistance. However, a low impedance clamp along curve C will keep the voltage slightly lower than the voltage required to reach $I_2$ along curves A and B and, thus, preclude the negative resistance region which causes localized thermal destruction.

Figure 6:
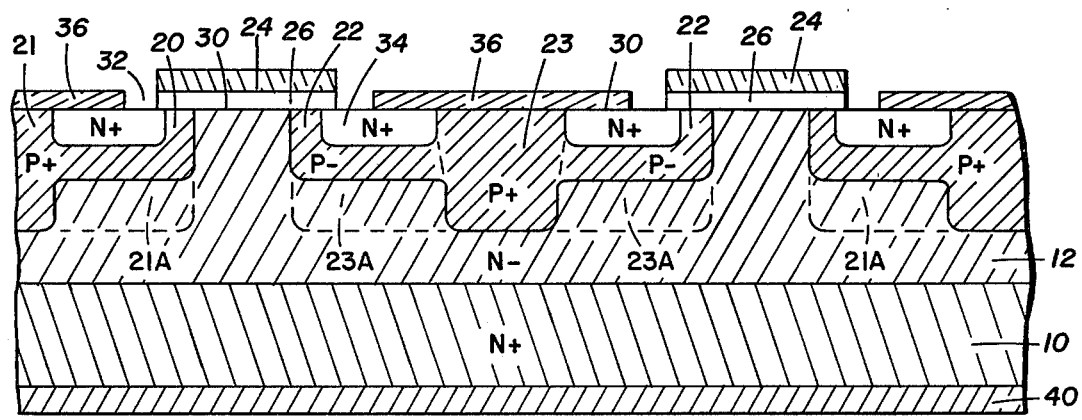
FIG. 6 is a cross section of a portion of a DMOS power device wherein the drain is flanked by the body on at least two sides at the surface.

The embodiment shown in FIG. 4 may be modified while retaining the advantages of the adjunct region herein before described by providing two source regions (such as 32 or 34) in each P— body region (such as 20 or 22) flanked on both sides by an N— drain region. The adjunct P+ region is located between the two source regions which may merge to surround the adjunct region at the surface. FIG. 6 shows this embodiment using the same reference numerals as FIG. 4. In the alternative, the adjunct region may partially surround the source at the surface as suggested by regions 21A and 23A in FIG. 4 and as further explained by FIG. 3.

The adjunct P+ regions 21 and 23 may also be used to reduce the lateral resistance in the base of the parasitic bipolar transistor as shown by FIGS. 3 and 4. In FIG. 3, which is a top view of an alternative embodiment (in which the source electrodes 36 and the gate electrode 24, as well as the surface oxide 14, have been omitted for clarity), and the source regions 32 and 34 are seen to be a series of N+ regions separated by regions 21A and 23A which are finger-like continuations of the P+ adjunct regions 21 and 23. If breakdown current tries to flow from the drain junction adjacent to channel regions 20 and 22 beneath source regions 32 and 34, respectively, the shunt conductance provided by regions 21A and 23A tends to prevent the buildup of a voltage which is high enough to engender the parasitic bipolar transistor action. In addition, the fact that the shunt regions 21A and 23A are in parallel with the base resistance underneath the effective emitters 32 and 34 tends to reduce the voltage gradient in these subemitter base regions so that if any bipolar transistor current does flow, it will be more uniformly distributed across the lower surface of the effective emitters 32 and 34 and, thus, less likely to lead to a destructive localized breakdown. It will be seen that, in FIG. 4, the source regions 32 and 34 are offset as they face each other across the channel regions 20 and 22. This feature is a desirable effect in that the effective drain resistance through the N— region 12 is reduced.

Figure 5:
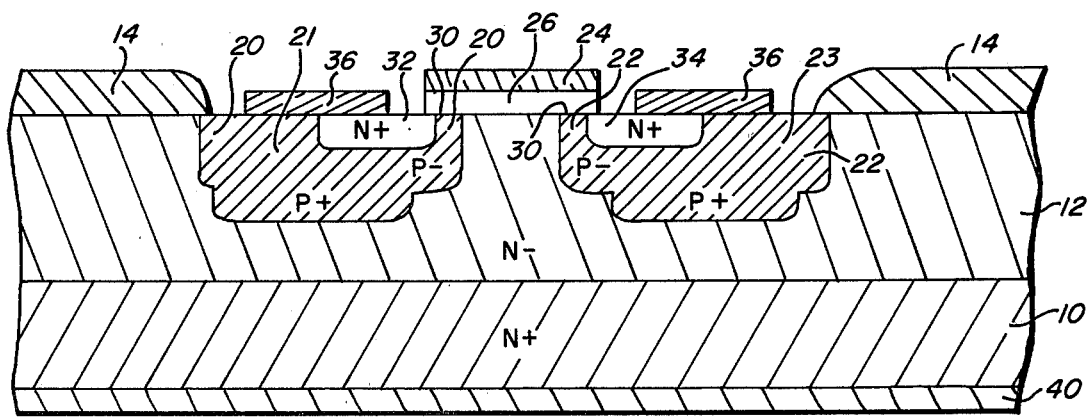
FIG. 5 is a cross section of a portion of a DMOS power device showing an alternative embodiment of the present invention.

FIG. 5 shows an alternative embodiment for a DMOS device which has improved reverse safe operating area. In FIG. 5, the adjunct P+ regions 21 and 23 extend beneath a major portion of source regions 32 and 34. Thus, they can serve both as a clamping diode and those means for reducing a lateral resistance underneath the effective emitters of a parasitic bipolar transistors.

The structure of FIG. 5 can be fabricated by, for example, implantation using the oxide regions 26 and 14 as a mask in order to keep the heavily doped P+ adjunct regions away from the active channel areas 30 beneath gate 24.

The above descriptions of preferred embodiments are given by way of example only and change in form and details may readily be affected by one skilled in the art without departing from the scope of the invention as defined by the insuing claims. For example, the means for improving the safe operating area in the reverse mode are generally applicable to power MOS transistors be they DMOS, V-groove, flat bottom V-groove, or U-groove. Structures and concepts described hereinbefore may readily be adapted to such alternate forms by techniques apparent to those skilled in the art.

What is claimed is:

1. An MOS transistor having improved breakdown characteristics comprising:
    a drain region of first conductivity type;
    a body region of a second conductivity type in said drain region and forming a P—N junction therewith;
    a source region of said first conductivity type in said body region;
    a gate for inducing a surface channel region in said body between said source and drain regions; and
    low impedance means for reducing the breakdown voltage of said P—N junction away from said channel region, said means including a second region of said second conductivity type merged with said body region and extending further into said drain region than does said body region.

2. An MOS transistor in accordance with claim 1 wherein said means including a region of said second conductivity type is more heavily doped than said body region.

3. An MOS transistor in accordance with claim 1 wherein said second region of said second conductivity type merged with said body region and extending further into said drain region than does said body region and also extends beneath said source region.

4. An MOS transistor having improved breakdown characteristics comprising:
   a substrate having a major surface;
   a drain region of first conductivity type;
   a body region of a second conductivity type in said drain region and forming a P—N junction therewith;
   a source region of said first conductivity type in said body region, each of said drain, body, and source regions including said surface;
   a gate for inducing a channel region at said surface in said body between said source and drain regions;
   metallic shorting means making contact with said source region and electrically connecting it with said body region away from said channel region at said surface; and
   shunt conductance means for reducing the resistance in said body region between said channel region and said shorting means, said means including a second region of said second conductivity type extending further into said drain region away from said surface than does said body region.

5. An MOS transistor in accordance with claim 4 having a plurality of source regions in a single body region, and said shunt conductance means comprising heavily-doped regions of second conductivity type interposed between said plurality of source regions at said surface and forming a portion of said body region.

6. An MOS transistor in accordance with claim 4 further including means for reducing the drain-body P—N junction breakdown voltage away from said channel region.

7. An MOS transistor in accordance with claim 4 wherein said second region of said second conductivity type also extends beneath said source region.

8. The transistor of claim 7 wherein said source region extends over only a portion of said second region of said second region of said second conductivity type.

9. An MOS transistor in accordance with claim 4 wherein said shunt conductance means comprises a plurality of heavily-doped regions of said second conductivity type merged with said body region, each of said heavily-doped regions being surrounded by said source region at said surface.

10. The MOS transistor of claim 9 wherein said plurality of heavily-doped regions of second conductivity type extend further into said drain region away from said surface than does said body region.

11. The MOS transistor of claim 10 wherein said drain region is flanked by a body region on at least two sides at said surface.

12. The MOS transistor of claim 11 wherein said drain region is surrounded by said body region at said surface.

13. The MOS transistor of claim 12 further comprising a body region flanked on two sides by said drain region at said surface.

14. An MOS device having improved breakdown characteristics comprising:
   a primary body region of a first conductivity type;
   a first region of a second conductivity type partially surrounding said body region and forming a P—N junction therewith;
   a second region of said second conductivity type in said body region, said first and second regions being the drain and source regions respectively, of said MOS device;
   gate means for controlling a surface channel region in said body between said first and second regions; and
   low impedance means for reducing the breakdown of said P—N junction away from channel region, said means including an adjunct body region of said first conductivity type extending further into said drain region than does said body region.

15. A method for forming an MOS device comprising the steps of:
   providing a primary body region of a first conductivity type;
   providing a first region of a second conductivity type partially surrounding said body region and forming a P—N junction therewith;
   providing a second region of said second conductivity type in said body region, said first and second regions being the drain and source regions respectively, of said MOS device;
   providing a gate for controlling a surface channel region in said body between said first and second regions; and providing low impedance means for reducing the breakdown of said P—N junction away from said channel region, said means including an adjunct body region of said first conductivity type extending further into said drain region than does said primary body region.

* * * * *